(12) United States Patent
Fujita et al.

(10) Patent No.: US 6,275,420 B1
(45) Date of Patent: Aug. 14, 2001

(54) SEMICONDUCTOR DEVICE HAVING MEMORY CELL PART AND TRANSFER CIRCUIT

(75) Inventors: Mikio Fujita; Hisaki Ishida, both of Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/552,690

(22) Filed: Apr. 19, 2000

(30) Foreign Application Priority Data

Jul. 28, 1999 (JP) .................................................. 11-214076

(51) Int. Cl.[7] .................................................. G11C 7/00
(52) U.S. Cl. .......................................... 365/189.05; 365/72
(58) Field of Search .................................. 365/189.05, 72

(56) References Cited

U.S. PATENT DOCUMENTS 5,379,264 * 1/1995 Kobayashi et al. ............. 365/230.06
6,069,834 * 5/2000 Watanabe et al. ............... 365/230.03

* cited by examiner

Primary Examiner—Trong Phan
Assistant Examiner—M. Tran
(74) Attorney, Agent, or Firm—Jones Volentine, PLLC

(57) ABSTRACT

A semiconductor device includes a memory cell part which has data input terminals and which stores data received at the data input terminals and a data bus which is supplied with data. The semiconductor device also includes a transfer circuit which is coupled between the data bus and the data input terminals and which transfers the data from the data bus to the data input terminals in response to a transfer selection signal. The semiconductor device also includes a transfer control circuit which receives a bit selection signal and outputs the transfer selection signal.

17 Claims, 4 Drawing Sheets

SEMICONDUCTOR DEVICE HAVING MEMORY CELL PART AND TRANSFER CIRCUIT

BACKGROUND OF THE INVENTION

1. Field of the Invention

The present invention generally relates to a semiconductor device including a memory cell part, and more particularly, to a semiconductor device having a circuit which performs bit processing operation to the memory cell part of the device.

This application is counterpart of Japanese patent application, Serial Number 214076/1999, filed July 28, the subject matter of which is incorporated herein by reference.

2. Description of the Related Art

In a semiconductor device such as a microprocessor, a bit processing operation may be performed to a memory cell part in an internal memory (for example, Static Random Access Memory).

The bit processing operation is a processing that rewrites only one bit or plural bits in a data (for example, 16 bits) stored in the memory cell part. Such the bit processing operation is performed frequently when a flag is set in the memory cell part.

The conventional bit processing operation is performed as follows, for example.

First, a flag data (for example, 16 bits) is read from a memory cell part by a control part and the read data is sent to an operation part ALU (Arithmetic and Logic Unit).

Next, the operation part performs a logic operation between the flag data and a predetermined number and thus a desired bit is rewritten.

One case is explained as an example. The case is that the first bit of a flag data of 1234h (namely, 0001 0010 0011 0100b) is set. The "h" indicates that the value thereof is the hexadecimal numeral. The "b" indicates that the value thereof is the binary numeral.

In this case, 0001h (namely, 0000 0000 0000 0001b) is added to this flag data 1234h by the operation part. Thereby, the flag data is changed to 1235h (namely, 0001 0010 0011 0101b). It means that the first bit of this flag data is set.

After that, the operation result is sent to the memory cell part and is overwritten to the memory cell part.

As mentioned above, in the conventional bit processing operation, a flag data comprised of plural bits is read from the memory cell part first. After that the operation processing is carried out and then the operation result is overwritten to the memory cell part.

For this reason, when a processing which uses the flag frequently is performed or when a bit processing operation is used frequently, the number of steps of processing increases.

For increase of such a number of steps, speed of an application becomes low by increase of processing time. Or, it becomes the cause unable to end processing within a frame.

Furthermore, when there are many steps, Read Only Memory having a large capacity will be needed.

For such a reason, there has been a need for an improved semiconductor device that can be performed a bit processing operation at a few steps.

SUMMARY OF THE INVENTION

It is an object of the present invention is to provide a semiconductor device that can execute a bit processing operation at a few steps.

It is another object of the present invention is to provide a semiconductor device that can improve processing time of a bit processing operation.

According to one aspect of the present invention, for achieving one or more of the above objects, there is provided a semiconductor device which includes a memory cell part which has data input terminals and which stores data received at the data input terminals and a data bus which is supplied with data. The semiconductor device also includes a transfer circuit which is coupled between the data bus and the data input terminals and which transfers the data from the data bus to the data input terminals in response to a transfer selection signal. The semiconductor device also includes a transfer control circuit which receives a bit selection signal and outputs the transfer selection signal.

The above and further objects and novel features of the invention will more fully appear from the following detailed description, appended claims and the accompanying drawings.

DETAILED DESCRIPTION OF THE PREFERRED EMBODIMENTS

Figure 1:
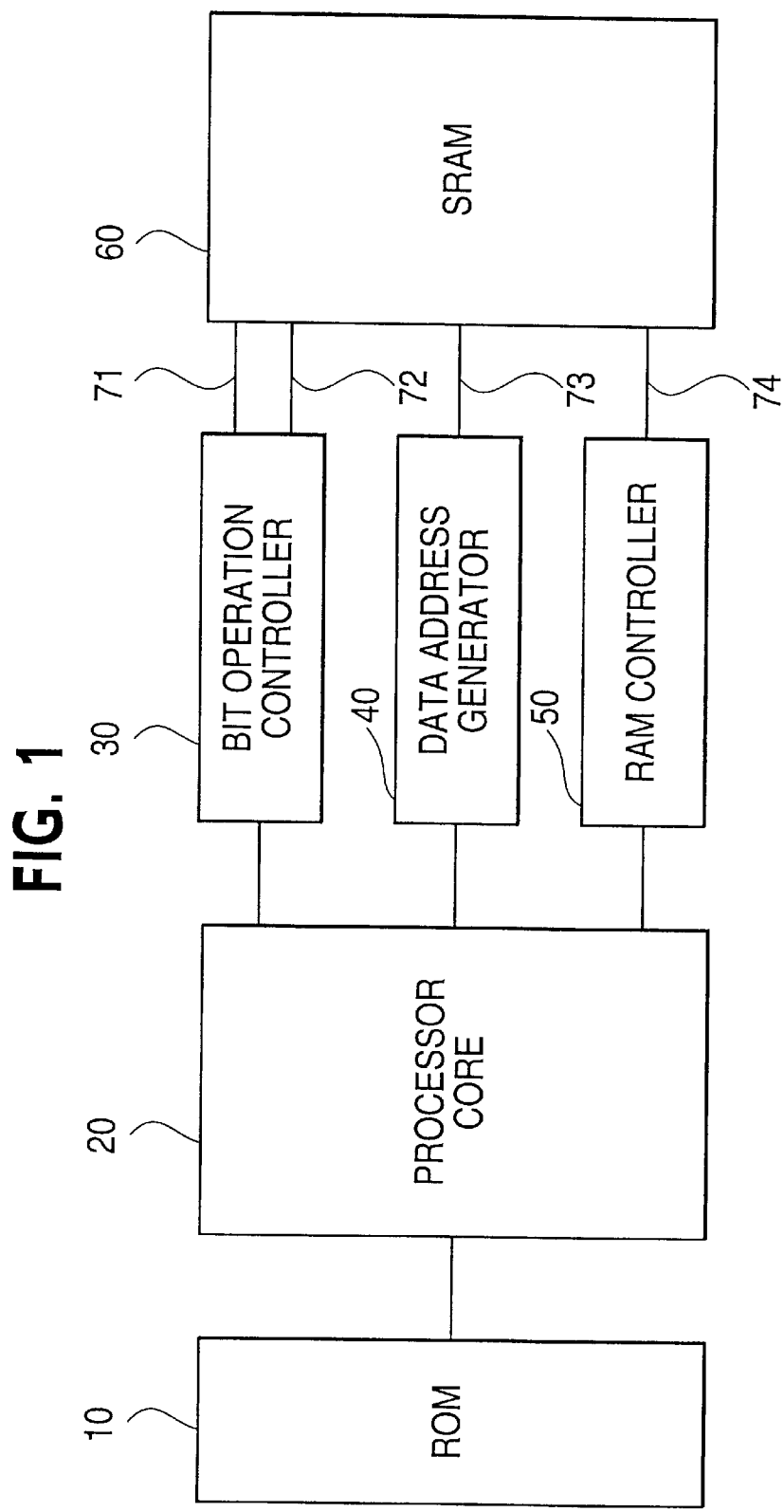
FIG. 1 is a block diagram showing an overall microprocessor structure according to a first preferred embodiment of the present invention.

A semiconductor device according to preferred embodiments of the present invention will be explained hereinafter with reference to figures. In order to simplify explanation, like elements are given like or corresponding reference numerals through this specification and figures. Dual explanations of the same elements are avoided.

However, it should be noted that the size, the shape and arrangement of structures are described as an example so as to understood the present invention briefly. Furthermore, a numerical value explained hereinafter indicates merely one example.

First Preferred Embodiment

A semiconductor device according to a first preferred embodiment of the present invention will be explained hereinafter. This embodiment is applied to a microprocessor.

FIG. 1 is a block diagram showing an overall microprocessor structure according to the first preferred embodiment of the present invention.

The microprocessor as shown in FIG. 1 has a ROM 10 (Read Only Memory 10), a processor core 20, a bit operation controller 30, a data address generator 40, a RAM controller 50, a SRAM 60, a data bus 71, a bit selection signal bus 72, an address bus 73 and a control signal line 74. In this embodiment, a data comprised of 16 bits is used.

The ROM 10 is used as a memory for storing a command program. The processor core 20 decodes a command read from the ROM 10. The bit operation controller 30, the data address generator 40 and the RAM controller 50 operates according to the decoded result of the processor core 20.

The bit operation controller 30 judges whether a command indicates a set command or a clear command at the time of bit processing execution. The bit operation controller 30 outputs all bits "1" (namely, ffffh) or all bits "0" (namely, 0000h) to the data bus 71 in parallel according to the result of the judgement.

In addition, the bit operation controller 30 judges a bit to be set or clear at the time of bit processing execution and generates a bit selection signal. The operation controller 30 outputs the bit selection signal to the bit selection signal bus 72 in parallel.

On the other hand, at the time of usual data writing, the bit operation controller 30 generates all bits "1" as the bit selection signal and outputs the all bits "1" to the bit selection signal 72 in parallel.

The data address generator 40 generates a write address or a read address when it carries out a write operation or a read operation to the SRAM 60 and outputs the generated write or read addresses to the address bus 73 in parallel.

The RAM controller 50 generates control signals such as a precharge signal PC, a write signal WR and an output enable signal OE and outputs these control signals to the control signal line 74.

the SRAM 60 memorizes data, a flag or the like.

Figure 2:
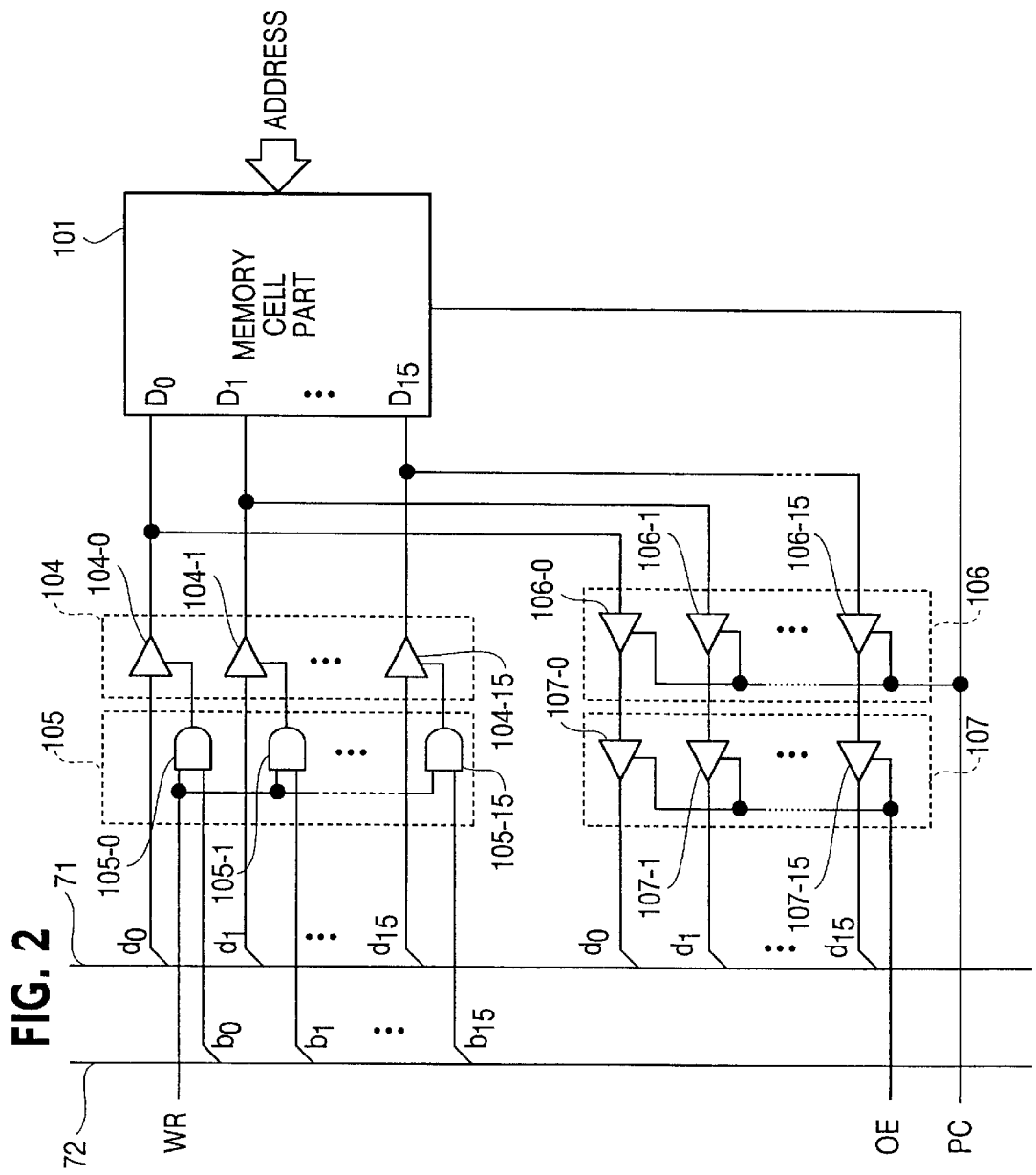
FIG. 2 is a circuit diagram showing an internal structure of SRAM.

FIG. 2 is a circuit diagram showing an internal structure of the SRAM 60.

As shown in FIG. 2, the SRAM 60 includes a memory cell part 101, a write buffer part 104, a buffer control part 105, a sense amplifier part 106 and a read buffer part 107.

The memory cell part 101 includes data input/output terminals D0 through D15 which receive 16 bits data and output 16 bits data in parallel, The memory cell part 101 receives an address signal from an address bus 73 (not shown in FIG. 2) Furthermore, the memory cell part 101 receives a precharge signal PC for initializing data stored in the memory cell part 101 from a control signal line 74 (not shown in FIG. 2).

The write buffer part 104 is comprised of tri-states buffers 104-0 through 104-15. An input terminal of respective buffers 104-0 to 104-15 is connected to the data bus 71 and receives one of data d0 through d15. Each of the data d0 through d15 corresponds to one of signal lines of the data bus 71.

Output terminals of buffers 104-0 through 104-15 are connected to the data input/output terminals D0 through D15 of the memory cell part 101, respectively. Furthermore, respective control terminals of buffers 104-0 to 104-15 receive a control signal from the buffer control part 105. Each of the buffers 104-0 to 104-15 outputs a signal which is received at the input terminal thereof when the control signal is in an H level. Each of the output terminals of the buffers 104-0 to 104-15 is made into a high-impedance state when the control signal is in an L level.

The buffer control part 105 is comprised of AND circuits 105-0 to 105-15. Each one of input terminals of AND circuits 105-0 to 105-15 is connected to the bit selection signal bus 72 and receives one of the bit selection signals b0 to b15.

The other input terminals of AND circuits 105-0 to 105-15 receives the write signal WR from the control signal line 74 commonly. Furthermore, the control signals are output from the output terminals of the AND circuits 105-0 through 105-15 to the write buffer part 104.

The sense amplifier part 106 is comprised of sense amplifiers 106-0 to 106-15. Input terminals of sense amplifiers 106-0 to 106-15 are connected to the data input/output terminals D0 to D15, respectively.

On the other hand, output terminals of the sense amplifiers 106-0 to 106-15 are connected to the read buffer part 107. Control terminals of the sense amplifiers 106-0 to 106-15 receive the precharge signal PC for initialization from the control signal line 74.

The read buffer part 107 is comprised of tri-state buffers 107-0 to 107-15. Input terminals of the buffers 107-0 to 107-15 are connected to the output terminals of the sense amplifiers 106-0 to 106-15, respectively.

On the other hand, each of output terminals of the buffers 107-0 to 107-15 is connected to a corresponding signal line of the data bus 71. Furthermore, control terminals of the buffers 107-0 to 107-15 receive an output enable signal OE from a control signal line 74.

Each of the buffers 107-0 to 107-15 outputs a signal which is received at the input terminal thereof when the output enable signal OE is in an H level. Each of the output terminals of the buffers 107-0 to 107-15 is made into a high-impedance state when the output enable signal OE is in an L level.

Next, an operation of the processor shown in FIG. 2 is explained. In the following explanation, a logic value of a high level signal is expressed at "1" and the logic value of a low level signal is expressed as "0".

First, usual data write operation and usual data read operation of this processor are explained.

When the usual data write operation is executed, the processor core 20 controls an operation part (not illustrated in figure) so that predetermined write data d0 through d15 are applied to the data bus 71. The bit operation controller 30 outputs all bits "1" (namely, ffffh) to the bit selection signal bus 72. Thereby, the write data is applied to the input terminals of the tri-state buffers 104-0 to 104-15 and the logic value "1" is applied to one of the input terminals of the AND circuits 105-0 to 105-15.

The data address generator 40 outputs the write address to the memory cell part 101 through the address bus 73.

When the RAM controller 50 sets the write signal WR to the logic value "1", the other input terminal of the AND circuits 105-0 to 105-15 receive the logic value "1". Since all outputs of the AND circuits 105-0 to 105-15 are "1", all control terminals of the tri-states buffers 104-1 to 104-15 go to also "1". Therefore, the buffers 104-1 to 104-15 transfer the data d0 through d15, which are input from the data bus 71, to the data input/output terminals D0 through D15 of the memory cell part 101. These data d0 through d15 are written in respective cells which correspond to the write address.

When usual data read operation is executed, the data address generator 40 send the read address to the memory cell part 101 through the address bus 73.

To this end, the data d0 to d15 are output from the data input/output terminals D0 to D15. The data d0 to d15 are sent to the read buffer part 107 through the sense amplifiers 106-0 to 106-15.

Then, when the RAM controller 50 sets the output enable signal OE to "1", the buffers 107-0 to 107-15 transfer the data d0 to d15 to the data bus 71.

Next, bit processing operation of this processor is explained.

When a bit setting operation is executed, the bit operation controller 30 outputs all "1" data (namely, ffffh) as data d0 through d15 to the data bus 71.

The bit operation controller 30 also outputs the bit selection signal, whose only one bit to be set is "1" and whose remaining bits are "0", to the bit selection signal bus 72. For example, when the third bit is to be set, the bit selection signal is 0004h (namely, 0000 0000 0000 0100b).

In this case, the logic value "1" is applied to the input terminals of tri-state buffers 104-0 through 104-15 and one input terminal of the AND circuit 105-2. The logic value "0" is applied to one input terminal of the other AND circuits.

The data address generator 40 transfers the write address to the memory cell part 101 through the address bus 73. Then, when the RAM controller 50 sets the write signal WR to "1", the logic value "1" is applied to the other input terminals of the AND circuits 105-0 through 105-15.

Thereby, the output of the AND circuit 105-2 goes to "1" and the outputs of the other AND circuits go to "0". Therefore, only the control terminal of the tri-state buffer 104-2 receives "1" and the control terminals of the remaining tri-state buffers receive "0".

The tri-state buffer 104-2 transfers the data "1" received from the data bus 71 to the data input/output terminal D2 of the memory cell part 101, but the output terminals of the other tri-state buffers are set to the high impedance states.

In this case, the logic value "1" is overwritten into the cell corresponding to the third bit of the memory cell part 101, but such this overwriting operation is not performed to cells corresponding to the other bits.

As a result, only predetermined bit (here the 3rd bit) can be set.

When a bit clearing operation is executed, the bit operation controller 30 outputs all "0" data (namely, 0000h) as data d0 through d15 to the data bus 71.

The bit operation controller 30 also outputs the bit selection signal, whose only one bit to be cleared is "1" and whose remaining bits are "0", to the bit selection signal bus 72. For example, when the third bit is to be cleared, the bit selection signal is 0004h (namely, 0000 0000 0000 0100b).

In this case, the logic value "1" is applied to the input terminals of tri-state buffers 104-0 through 104-15 and one input terminal of the AND circuit 105-2. The logic value "0" is applied to one input terminal of the other AND circuits.

The data address generator 40 transfers the write address to the memory cell part 101 through the address bus 73. Then, when the RAM controller 50 sets the write signal WR to "1", the logic value "1" is applied to the other input terminals of the AND circuits 105-0 through 105-15.

Thereby, the output of the AND circuit 105-2 goes to "1" and the outputs of the other AND circuits go to "0". Therefore, only the control terminal of the tri-state buffer 104-2 receives "1" and the control terminals of the remaining tri-state buffers receive "0".

The tri-state buffer 104-2 transfers the data "0" received from the data bus 71 to the data input/output terminal D2 of the memory cell part 101, but the output terminals of the other tri-state buffers are set to the high impedance states.

In this case, the logic value "0" is overwritten into the cell corresponding to the third bit of the memory cell part 101, but such this overwriting operation is not performed to cells corresponding to the other bits.

As a result, only predetermined bit (here the 3rd bit) can be cleared.

In addition, the bit setting operation and the bit clearing operation can also be carried out simultaneously.

As explained above, in the microprocessor of the preferred embodiment, the bit data can be written into the memory cell part directly. Therefore, since the bit processing operation is executed by processing of only one step, an operation speed can be improved. Furthermore, an increase of storage capacity of the ROM 10 can be prevented. Operation speed becomes equivalent to a write speed to the memory cell part 101.

Moreover, since the microprocessor of the preferred embodiment can be obtained by merely adding the AND circuit part 105, changing the circuit design from the conventional microprocessor is easy.

Furthermore, at the microprocessor of the preferred embodiment, since the operation part is not used to the bit processing operation, a bit processing module provided in the operation part is unnecessary. Therefore, reducing circuit area of an integrated circuit can be achieved.

Second Preferred Embodiment

A semiconductor device according to a second preferred embodiment of the invention will be explained hereinafter. This embodiment is applied to a microprocessor.

The main part of a microprocessor according to this embodiment is the same as that of FIG. 1.

Figure 3:
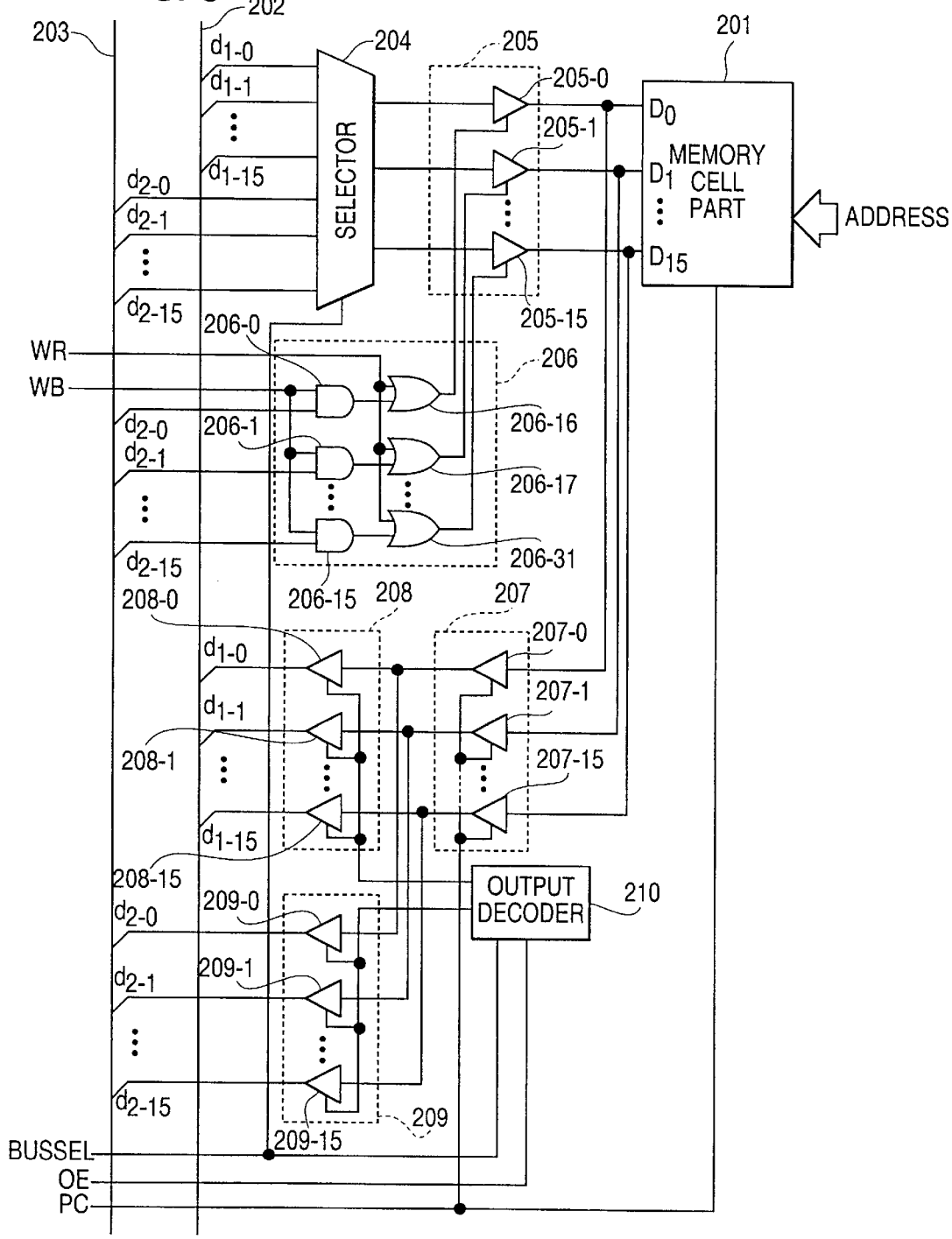
FIG. 3 is a circuit diagram showing an internal structure of SRAM.

However, as shown in FIG. 3, two data buses 202 and 203 are used instead of the data bus 71 and the bit selection signal bus 72. Furthermore, the RAM controller 50 also generates a bus selection signal BUS SEL and a bit processing signal WB and outputs them to a control signal line 74.

FIG. 3 is a circuit diagram showing an internal structure of the SRAM.

The SRAM according to this embodiment includes a memory cell part 201, a selector 204, a write buffer part 205, a buffer control part 206, a sense amplifier part 207, two read buffer parts 208 and 209, and an output decoder 210. Data comprised of 16 bits is also used in this embodiment.

The memory cell part 201 includes data input/output terminals D0 through D15 which receive 16 bits data and output 16 bits data in parallel. The memory cell part 201 receives an address signal from the address bus 73, Furthermore, the memory cell part 101 receives the precharge signal PC from the RAM controller.

A first data bus 202 transfers 16 bits data d1-0 through d1-15 in parallel. A second data bus 203 transfers 16 bits data d2-0 through d2-15 in parallel. As explained later, when the bit processing operation is executed, the second data bus 203 transmits the bit selection signal in parallel.

The selector 204 selects one of the data buses 202 and 203, and transmits the data of selected one of the data buses 202 and 203 to the write buffer part 205.

The write buffer part 205 is comprised of tri-state buffers 205-0 through 205-15. An input terminal of respective buffers 205-0 through 205-15 is connected to corresponding output terminal of the selector 204.

Output terminals of the buffers 205-0 through 205-15 are connected to the data input/output terminals D0 through D15 of the memory cell part 201, respectively. Furthermore, respective control terminals of the buffers 205-0 through 205-15 receive a control signal form the buffer control part 206.

Each of the buffers 205-0 to 205-15 outputs a signal which is received at the input terminal thereof when the control signal is in an H level. Each of the output terminals of the buffers 205-0 to 205-15 is made into a high impedance state when the control signal is in an L level.

The buffer control part 206 is comprised of AND circuits 206-0 through 206-15 and OR circuits 206-16 through 206-31. Each one of input terminals of the AND circuits 206-0 through 206-15 is connected to the data bus 203.

The other input terminals of the AND circuits 206-0 through 206-15 receive the bit processing signal WB commonly. Output terminals of the AND circuits 206-0 through 206-15 are connected to one input terminals of the OR circuits 206-16 through 206-31, respectively.

The other input terminals of the OR circuits 206-16 through 206-31 receive the write signal WR commonly. The output terminals of the OR circuits 206-16 through 206-31 output the control signal to the write buffer part 205.

The sense amplifier part 207 is comprised of sense amplifiers 207-0 through 207-15. Input terminals of the sense amplifiers 207-0 through 207-15 are connected to the data input/output terminals D0 through D15, respectively. Output terminals of the sense amplifiers 207-0 through 207-15 are connected to the read buffer parts 208 and 209.

The first read buffer part 208 is comprised of tri-state buffers 208-0 through 208-15. The input terminals of the buffers 208-0 to 208-15 are connected to corresponding output terminals of the buffers 207-0 to 207-15. The output terminals of the buffers 208-0 to 208-15 are connected to the data bus 202.

Each of the buffers 208-0 to 208-15 outputs a signal which is received at the input terminal thereof when the control signal is in an H level. Each of the output terminals of the buffers 208-0 to 208-15 is made into a high impedance state when the control signal is in an L level.

The second read buffer part 209 is comprised of tri-state buffers 209-0 through 209-15. The input terminals of the buffers 209-0 to 209-15 are connected to corresponding output terminals of the buffers 207-0 to 207-15. The output terminals of the buffers 209-0 to 209-15 are connected to the data bus 203.

Each of the buffers 209-0 to 209-15 outputs a signal which is received at the input terminal thereof when the control signal is in an H level. Each of the output terminals of the buffers 209-0 to 209-15 is made into a high impedance state when the control signal is in an L level.

The output decoder 210 receives the bus selection signal BUS SEL and the output enable signal OE. The output decoder 210 outputs a control signal which is responded to the bus selection signal BUS SEL when the output enable signal OE is in an H level.

Next, an operation of the processor shown in FIG. 3 is explained. In the following explanation, a logic value of a high level signal is expressed as "1" and the logic value of a low level signal is expressed as "0".

First, usual data write operation and usual read operation of this processor are explained.

When the usual data write operation is executed, the RAM controller 50 sets the bit processing signal WB to "0" and selects one of the data buses 202 and 203 by using the bus section signal BUS SEL. Since the bit processing signal WB is "0", the AND circuits 206 through 206-15 output "0".

The selector 204 electrically connects the data bus, which is selected by the bus selection signal BUS SEL, to the buffers 205-0 through 205-15.

The processor core 20 controls an operation part (not illustrated in figure) so that predetermined write data is applied to the selected data bus. The data applied to the selected data bus is applied to the buffers 205-0 to 205-15 by way of the selector 204.

The data address generator 40 outputs the write address to the memory cell part 201 through the address bus 73.

When the RAM controller 50 sets the write signal WR to the logic value "1", the OR circuits 206-16 to 206-31 output the logic value "1".

Therefore, the buffers 205-1 through 205-15 transfer the data, which are input from the selector 204, to the data input/output terminals D0 through D15 of the memory cell part 201.

When usual data read operation is executed, the data address generator 40 send the read address to the memory cell part 201 through the address bus 73.

To this end, the data d0 to d15 are output from the data input/output terminals D0 to D15. The data d0 to d15 are sent to the read buffer part 208 and 209 through the sense amplifiers 207-0 to 207-15.

Then, when the RAM controller 50 selects one of the data buses 202 and 203 by using the bus selection signal BUS SEL and sets the output enable signal OE to "1".

The output decoder 210 outputs the control signal of the logic value "1" to one of the read buffer parts 208 and 209 that corresponds to the data bus which is selected by the bus selection signal BUS SEL. The output decoder 210 outputs the control signal of the logic value "0" to the other of the read buffer parts 208 and 209 that corresponds to the data bus which is not selected by the bus selection signal BUS SEL.

Thereby, the data is output from selected one of the read buffers 208 and 209 to the data bus which is selected by the bus selection signal BUS SEL.

Next, bit processing operation of this processor is explained.

When a bit setting operation is executed, the RAM controller 50 sets the write signal WR and the bit processing signal WB to "0".

The bit operation controller 30 outputs all "1" data (namely, ffffh) as data d0 through d15 to the first data bus 202. The bit operation controller 30 also outputs the bit selection signal, whose only one bit to be set is "1" and whose remaining bits are "0", to the second data bus 203. For example, when the third bit is to be set, the bit selection signal is 0004h (namely, 0000 0000 0000 0100b).

In addition, the RAM controller 50 selects the first data bus 202 by using the bus selection signal BUS SEL.

In this case, the logic value "1" is applied to the input terminals of tri-state buffers 205-0 through 205-15 and one input terminal of the AND circuit 206-2. The logic value "0" is applied to one input terminals of the other AND circuits.

The data address generator 40 transfers the write address to the memory cell part 201 through the address bus 73. Then, when the RAM controller 50 sets the bit processing signal WB to "1", the logic value "1" is applied to the other input terminals of the AND circuits 206-0 through 206-15.

Thereby, the output of the AND circuit 206-2 goes to "1" and the outputs of the other AND circuits go to "0". Therefore, only the control terminal of the tri-state buffer 205-2 receives "1" and the control terminals of the remaining tri-state buffers receive "0".

The tri-state buffer 205-2 transfers the data "1" received from the data bus 202 to the data input/output terminal D2 of the memory cell part 201, but the output terminals of the other tri-state buffers are set to the high impedance states.

In this case, the logic value "1" is overwritten into the cell corresponding to the third bit of the memory cell part 201, but such this overwriting operation is not performed to cells corresponding to the other bits.

As a result, only predetermined bit (here the 3rd bit) can be set.

When a bit clearing operation is executed, the RAM controller 50 sets the write signal WR and the bit processing signal WB to "0".

The bit operation controller 30 outputs all "0" data (namely, 0000h) as data d0 through d15 to the first data bus 202.

The bit operation controller 30 also outputs the bit selection signal, whose only one bit to be cleared is "1" and whose remaining bits are "0", to the second data bus 203. For example, when the third bit is to be cleared, the bit selection signal is 0004h (namely, 0000 0000 0000 0100b).

In addition, the RAN controller 50 selects the first data bus 202 by using the bus selection signal BUS SEL.

In this case, the logic value "1" is applied to the input terminals of tri-state buffers 205-0 through 205-15 and one input terminal of the AND circuit 206-2. The logic value "0" is applied to one input terminals of the other AND circuits.

The data address generator 40 transfers the write address to the memory cell part 201 through the address bus 73. Then, when the RAM controller 50 sets the bit processing signal WR to "1", the logic value "1" is applied to the other input terminals of the AND circuits 206-0 through 206-15.

Thereby, the output of the AND circuit 206-2 goes to "1" and the outputs of the other AND circuits go to "0". Therefore, only the control terminal of the tri-state buffer 205-2 receives "1" and the control terminals of the remaining tri-state buffers receive "0".

The tri-state buffer 205-2 transfers the data "0" received from the data bus 202 to the data input/output terminal D2 of the memory cell part 201, but the output terminals of the other tri-state buffers are set to the high impedance states.

In this case, the logic value "0" is overwritten into the cell corresponding to the third bit of the memory cell part 201, but such this overwriting operation is not performed to cells corresponding to the other bits.

As a result, only predetermined bit (here the 3rd bit) can be cleared.

In addition, the bit setting operation and the bit clearing operation can also be carried out simultaneously.

As explained above, in the microprocessor of the preferred embodiment, since the bit selection signal is transmitted by using the data bus 203, a special bus for transferring the bit selection signal is unnecessary.

Furthermore, since the bit processing operation is executed by processing of only one step, an operation speed can be improved. An increase of storage capacity of the ROM also can be prevented.

Moreover, since the microprocessor of the preferred embodiment can be obtained by adding only a few logic circuits, changing the circuit design from the conventional microprocessor is easy.

Furthermore, at the microprocessor of the preferred embodiment, since the operation part is not used to the bit processing operation, a bit processing module provided in the operation part is unnecessary. Therefore, reducing circuit area of an integrated circuit can be achieved.

Third Preferred Embodiment

A semiconductor device according to a third preferred embodiment of the invention will be explained hereinafter. This embodiment is applied to a microprocessor.

The main part of a microprocessor according to this embodiment is the same as that of FIG. 1. Therefore, explanations with respect to the whole structure of the microprocessor are omitted.

Figure 4:
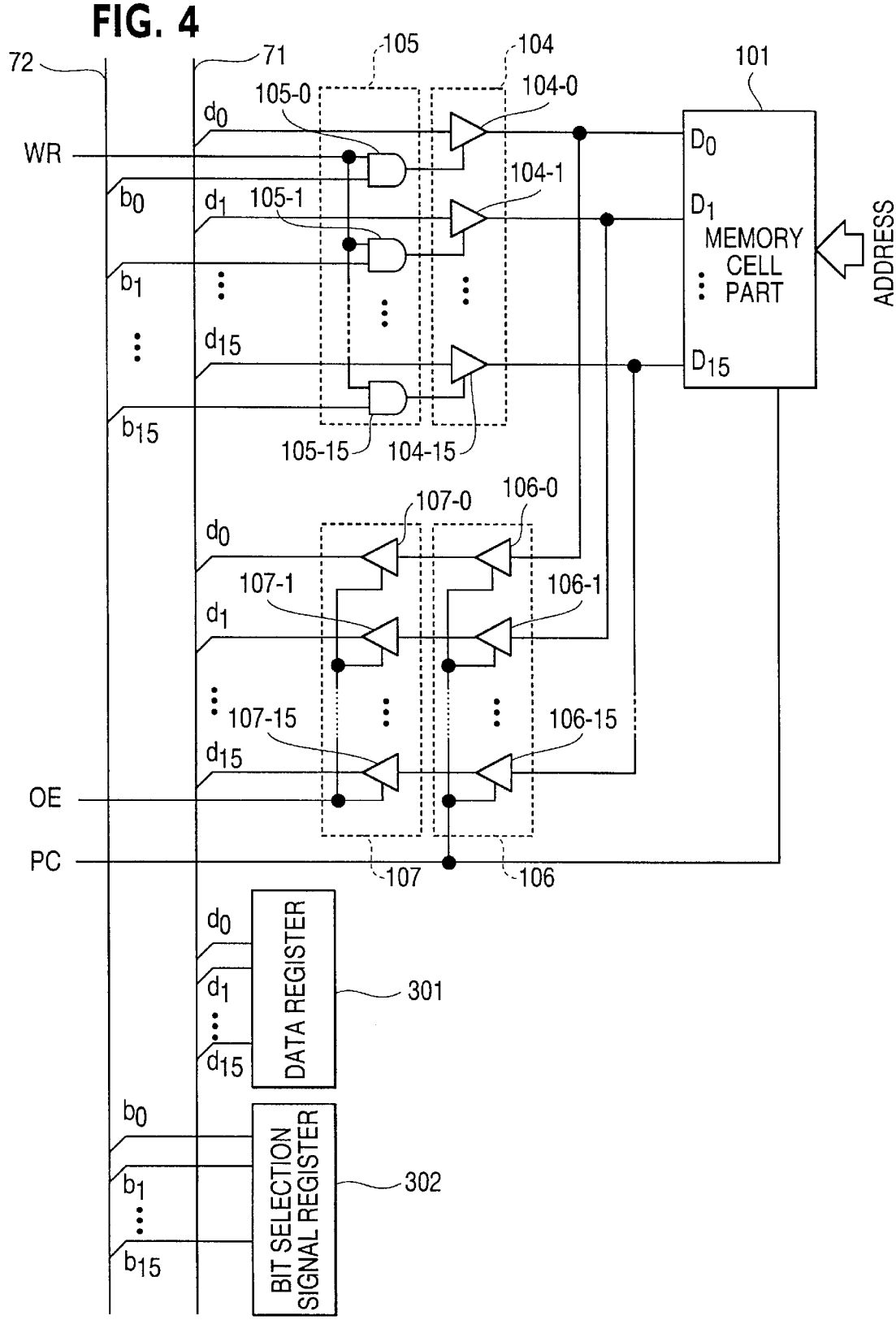
FIG. 4 is a circuit diagram showing an internal structure of SRAM.

FIG. 4 is a circuit diagram showing an internal structure of the SRAM.

The difference between the third preferred embodiment and the second preferred embodiment resides in that there is provided a data register 301 and a bit selection signal register 302.

The data register 301 stores 16 bits data and outputs stored 16 bits data to the data bus 71.

The bit selection signal register 302 stores the bit selection signal of 16 bits and outputs stored bit selection signal to the bit selection signal bus 72.

Next, an operation of the processor shown in FIG. 4 is explained. In the following explanation, a logic value of a high level signal is expressed as "1" and the logic value of a low level signal is expressed as "0".

First, usual data write operation and usual read operation of this processor are explained.

When the usual data write operation is executed, the processor core 20 controls an operation part (not illustrated in figure) so that predetermined write data d0 through d15 are applied to the data bus 71. Also, the processor core 20 controls the operation part so that the bit selection signal register 302 outputs all "1" data stored therein in to the bit selection signal bus 72.

Thereby, the write data is applied to the input terminals of the tri-state buffers 104-0 to 104-15 and the logic value "1" is applied to one input terminals of the AND circuits 105-0 to 105-15.

The data address generator 40 outputs the write address to the memory cell part 101 through the address bus 73.

When the RAM controller 50 sets the write signal WR to "1", the other input terminals of the AND circuits 105-0 to 105-15 receive "1". Since all outputs of the AND circuits 105-0 to 105-15 are "1", all control terminals of the tri-states buffers 104-1 to 104-15 go to also "1". Therefore, the buffers 104-1 to 104-15 transfer the data d0 through d15, which are input from the data bus 71, to the data input/output terminals D0 through D15 of the memory cell part 101. These data d0 through d15 are written in respective cells which correspond to the write address.

When usual data read operation is executed, the data address generator 40 send the read address to the memory cell part 101 through the address bus 73.

To this end, the data d0 to d15 are output from the data input/output terminals D0 to D15. The data d0 to d15 are sent to the read buffer part 107 through the sense amplifiers 106-0 to 106-15.

Then, when the RAM controller 50 sets the output enable signal OE to "1", the buffers 107-0 to 107-15 transfer the data d0 to d15 to the data bus 71.

Next, bit processing operation of this processor is explained.

When a bit setting operation is executed, the processor core 20 controls the bit operation controller 30 so that the data register 301 outputs all "1" data (namely, ffffh) stored therein to the data bus 71.

The processor core 20 also controls the bit operation controller 30 so that the bit selection signal register 302 outputs the bit selection signal, whose predetermined bits to be set are "1" and whose remaining bits are "0", to the bit selection signal bus 72. For example, when the third, the seventh and the eleventh bits are to be set, the bit selection signal is 0444h (namely, 0000 0100 0100 0100b).

In this case, the logic value "1" is applied to the input terminals of tri-state buffers 104-0 through 104-15 and one input terminals of the AND circuit 105-2, 105-6 and 105-10. The logic value "0" is applied to one input terminals of remaining AND circuits.

The data address generator 40 transfers the write address to the memory cell part 101 through the address bus 73. Then, when the RAM controller 50 sets the write signal WR to "1", the logic value "1" is applied to the other input terminals of the AND circuits 105-0 through 105-15.

Thereby, the outputs of the AND circuit 105-2, 105-6 and 105-10 go to "1" and the outputs of the remaining AND circuits go to "0". Therefore, only the control terminal of the tri-state buffers 104-2, 104-6 and 104-10 receive "1" and the control terminals of the remaining tri-state buffers receive "0".

The tri-state buffers 104-2, 104-6 and 104-10 transfer the data "1" received from the data bus 71 to the data input/output terminal D2, D6 and D10, respectively, but the output terminals of the other tri-state buffers are set to the high impedance states.

In this case, the logic value "1" is overwritten into the cells corresponding to the third, the seventh and the eleventh bits of the memory cell part 101, but such this overwriting operation is not performed to cells corresponding to the other bits.

As a result, only predetermined bits (here the third bit, the seventh bit and the eleventh bit) can be set.

When a bit clearing operation is executed, the processor core 20 controls the bit operation controller 30 so that the data register 301 outputs all "0" data (namely, 0000h) stored therein to the data bus 71.

The processor core 20 also controls the bit operation controller 30 so that the bit selection signal register 302 outputs the bit selection signal, whose predetermined bits to be cleared are "1" and whose remaining bits are "0", to the bit selection signal bus 72. For example, when the third, seventh and eleventh bits are to be cleared, the bit selection signal is 0444h (namely, 0000 0100 0100 0100b).

The data address generator 40 transfers the write address to the memory cell part 101 through the address bus 73. Then, when the RAM controller 50 sets the write signal WR to "1", the logic value "1" is applied to the other input terminals of the AND circuits 105-0 through 105-15.

Thereby, the outputs of the AND circuits 105-2, 105-6 and 105-10 go to "1" and the outputs of the other AND circuits go to "0". Therefore, only the control terminals of the tri-state buffers 104-2, 105-6 and 105-10 receive "1" and the control terminals of the remaining tri-state buffers receive "0".

The tri-state buffers 104-2, 105-6 and 105-10 transfer the data "0" received from the data bus 71 to the data input/output terminals D2, D6 and D10, respectively, but the output terminals of the other tri-state buffers are set to the high impedance states.

In this case, the logic value "0" is overwritten into the cells corresponding to the third bit, seventh bit and eleventh bit of the memory cell part 101, but such this overwriting operation is not performed to cells corresponding to the other bits.

As a result, only predetermined bits (here the third bit, the seventh bit and the eleventh bit) can be cleared.

In addition, the bit setting operation and the bit clearing operation can also be carried out simultaneously.

As explained above, in the microprocessor of the preferred embodiment, since the register 301 is provided, all bits "1" data and all bits "0" data do not need to be created each time. Therefore, a processing in which a bit setting processing and a bit clearing processing are executed can be simplified.

Moreover, since the bit selection signal register 302 is provided, the bit selection signal do not need to be generated each time when the bit setting process or the bit clearing process are executed to the same bit continuously. Therefore, the bit processing operation can be simplified.

A process that the bit setting process and the bit clearing process are executed simultaneously also can be simplified by using the registers 301 and 302.

In addition, when the bit selection signal register 302 does not need to be used, the bit setting and clearing processes may be executed by the same operation as the first preferred embodiment.

Since a bit processing operation can be executed only by processing of one step, a processing speed can be improved.

An increase of storage capacity of the ROM also can be prevented.

Moreover, since the microprocessor of the preferred embodiment can be obtained by adding only a few logic circuits, changing the circuit design from the conventional microprocessor is easy.

Furthermore, at the microprocessor of the preferred embodiment, since the operation part is not used to the bit processing operation, a bit processing module provided in the operation part in unnecessary. Therefore, reducing circuit area of an integrated circuit can be achieved.

While the preferred form of the present invention has been described, it is to be understood that modifications will be apparent to those skilled in the art without departing from the spirit of the invention. The scope of the invention is to be determined solely by the following claims.

What is claimed is:

1. A semiconductor device comprising:
    a memory cell part which has data input terminals and which stores data received at the data input terminals;
    a first data bus which is supplied with a bit processing signal comprised of a plurality of bits;
    a second data bus which is supplied with a bit selection signal comprised of a plurality of bits;
    a selector which is coupled to said first and second data buses and which transfers either the bit processing signal or the bit selection signal in response to a bus selection signal;
    a transfer circuit which is coupled between said selector and the data input terminals and which transfers a signal from said selector to the data input terminals in response to a transfer selection signal; and
    a transfer control circuit which receives the bit selection signal and outputs the transfer selection signal.

2. A semiconductor device as set forth claim 1, wherein said transfer control circuit produces the transfer selection signal having a plurality of bits in response to the bit selection signal.

3. A semiconductor device as set forth claim 2, wherein said transfer circuit comprises a plurality of buffers, each of which has an input node coupled to said selector, an output node coupled to a corresponding data input terminal of the data input terminals and a control terminal receiving a bit of the transfer selection signal, wherein each of the buffers transfers a signal received at the input node thereof to the corresponding data input terminal of the data input terminals when a corresponding control terminal of the buffers receives a bit having a first voltage level and wherein each of the output nodes of the buffers is made into a high impedance state when a corresponding control terminal of the buffers receives a bit having a second voltage level.

4. A semiconductor device as set forth claim 3, wherein the number of bits of the transfer selection signal and the number of bits of the bit selection signal correspond to the number of buffer circuits.

5. A semiconductor device as set forth claim 4, further comprising;
   a data register having a plurality of bits each of which stores a bit of the bit processing signal; and
   a bit selection signal register having a plurality of bits each of which stores a bit of the bit selection signal.

6. A semiconductor device as set forth claim 3, wherein said transfer control circuit receives a write signal and a bit processing signal, said transfer control circuit outputs the transfer selection signal having the bits which are set to the first voltage levels when the write signal is in the first voltage level and outputs the transfer selection signal having the bits each of which is set to a predetermined voltage level when the write signal is in the second voltage level and the bit processing signal is in the first voltage level.

7. A semiconductor device as set forth claim 6, wherein a bit of the transfer selection signal corresponding to a bit to be set or cleared is set to the first voltage level and remaining bit of the transfer selection signal is set to the second voltage level.

8. A semiconductor device comprising:
   a memory cell part which has data input terminals and which stores data received at the data input terminals;
   a data bus which is applied to a bit processing signal having a plurality of bits;
   a bit selection signal bus which is applied to a bit selection signal having a plurality of bits;
   a transfer circuit which is coupled between said data bus and the data input terminals and which transfers the bit processing signal from said data bus to the data input terminals in response to a transfer selection signal; and
   a transfer control circuit which receives the bit selection signal and outputs the transfer selection signal.

9. A semiconductor device as set forth claim 8, wherein said transfer control circuit produces the transfer selection signal having a plurality of bits in response to the bit selection signal.

10. A semiconductor device as set forth claim 9, wherein said transfer circuit comprises a plurality of buffers, each of which has an input node coupled to said data bus, an output node coupled to a corresponding data input terminal of the data input terminals and a control terminal receiving a bit of the transfer selection signal, wherein each of the buffers transfers a bit processing signal received at the input node thereof to the corresponding data input terminal of the data input terminals when a corresponding control terminal of the buffers receives a bit having a first voltage level and wherein each of the output nodes of the buffers is made into a high impedance state when a corresponding control terminal of the buffers receives a bit having a second voltage level.

11. A semiconductor device as set forth claim 10, wherein a bit of the transfer selection signal corresponding to a bit to be set or cleared is set to the first voltage level and remaining bit of the transfer selection signal is set to the second voltage level.

12. A semiconductor device as set forth claim 10, wherein the number of bits of the transfer selection signal and the number of bits of the bit selection signal correspond to the number of buffer circuits.

13. A semiconductor device as set forth claim 11, further comprising;
   a data register having a plurality of bits each of which stores a bit of the data supplied to said data bus; and
   a bit selection signal register having a plurality of bits each of which stores a bit of the bit selection signal.

14. A semiconductor device comprising;
   a memory cell part which has data input terminals and which stores data received at the data input terminals;
   a data bus which is supplied with data;
   a plurality of buffers, each of which has an input node coupled to said data bus, an output node coupled to a corresponding data input terminal of the data input terminals and a control terminal receiving a transfer selection signal, and each of which transfers data received at the input node thereof to the corresponding data input terminal of the data input terminals when a corresponding control terminal of the buffers receives a first voltage level, and each of the output nodes of the buffers being made into a high impedance state when a corresponding control terminal of the buffers receives a second voltage level; and
   a transfer control circuit which receives a bit selection signal and outputs the transfer selection signal.

15. A semiconductor device as set forth claim 14, wherein the transfer selection signal has a plurality of bits and wherein a bit of the transfer selection signal corresponding to a bit to be set or cleared is set to the first voltage level and a remaining bit of the transfer selection signal is set to the second voltage level.

16. A semiconductor device as set forth claim 14, wherein the transfer selection signal has a plurality of bits and wherein the number of bits of the transfer selection signal and the number of bits of the bit selection signal correspond to the number of buffer circuits.

17. A semiconductor device as set forth in claim 15, further comprising:
   a data register having a plurality of bits each of which stores a bit of the data supplied to said data bus; and
   a bit selection signal register having a plurality of bits each of which stores a bit of the bit selection signal.

* * * * *